US010732214B2

(12) United States Patent
Lewis et al.

(10) Patent No.: US 10,732,214 B2
(45) Date of Patent: Aug. 4, 2020

(54) COMMUNICATION-LESS FAULT SECTION IDENTIFICATION FOR HYBRID HVDC TRANSMISSION SYSTEMS

(71) Applicant: UNIVERSITY OF PITTSBURGH—OF THE COMMONWEALTH SYSTEM OF HIGHER EDUCATION, Pittsburgh, PA (US)

(72) Inventors: Patrick Thomas Lewis, Aspinwall, PA (US); Brandon M. Grainger, Pittsburgh, PA (US); Hashim Abbas Al Hassan, Pittsburgh, PA (US); Gregory Francis Reed, Gibsonia, PA (US)

(73) Assignee: University of Pittsburgh—Of the Commonwealth System of Higher Education, Pittsburgh, PA (US)

( * ) Notice: Subject to any disclaimer, the term of this patent is extended or adjusted under 35 U.S.C. 154(b) by 280 days.

(21) Appl. No.: 15/576,650

(22) PCT Filed: May 19, 2016

(86) PCT No.: PCT/US2016/033218
§ 371 (c)(1),
(2) Date: Nov. 22, 2017

(87) PCT Pub. No.: WO2016/191187
PCT Pub. Date: Dec. 1, 2016

(65) Prior Publication Data
US 2018/0120367 A1    May 3, 2018

Related U.S. Application Data

(60) Provisional application No. 62/166,869, filed on May 27, 2015.

(51) Int. Cl.
*G01R 31/08*    (2020.01)
*H01H 9/54*     (2006.01)
(Continued)

(52) U.S. Cl.
CPC ............. *G01R 31/085* (2013.01); *H01H 9/54* (2013.01); *H02H 1/0007* (2013.01);
(Continued)

(58) Field of Classification Search
USPC .................................................... 361/62–69
See application file for complete search history.

(56) References Cited

U.S. PATENT DOCUMENTS

2008/0158756 A1    7/2008  Lindsey et al.
2012/0234796 A1    9/2012  Juhlin
(Continued)

FOREIGN PATENT DOCUMENTS

WO    WO 2013/071974    5/2013
WO    WO 2015/070942    5/2015

OTHER PUBLICATIONS

International Search Report and Written Opinion for related International Application No. PCT/US2016/033218, dated Sep. 5, 2016, 13 pages.

*Primary Examiner* — Danny Nguyen
(74) *Attorney, Agent, or Firm* — Klarquist Sparkman, LLP

(57) ABSTRACT

Disclosed herein are methods, systems, and devices for identifying a location of a fault in a hybrid high voltage direct current (HVDC) transmission system having a ground or underground cable section and an overhead line section. Some methods comprise determining whether a characteristic voltage oscillation is present at a cable side terminal of the HVDC transmission system, and in response, determining that the fault is located in the overhead line section.

(Continued)

Some methods comprise determining whether a characteristic current oscillation or a terminal current exceeding a peak current threshold is present at an overhead line side terminal, and in response, determining that the fault is located in the overhead line section. The methods can be communication-less, wherein the actions are based on local measurements and/or are performed locally to where the fault is located or detected.

31 Claims, 5 Drawing Sheets

(51) Int. Cl.
| | |
|---|---|
| H02H 1/00 | (2006.01) |
| H02H 7/26 | (2006.01) |
| H02J 1/00 | (2006.01) |
| G01R 15/18 | (2006.01) |
| H01H 9/00 | (2006.01) |
| H02H 3/20 | (2006.01) |
| H02H 3/08 | (2006.01) |

(52) U.S. Cl.
CPC ............. *H02H 7/268* (2013.01); *G01R 15/18* (2013.01); *G01R 31/08* (2013.01); *H01H 9/00* (2013.01); *H02H 3/08* (2013.01); *H02H 3/20* (2013.01); *H02J 1/00* (2013.01)

(56) References Cited

U.S. PATENT DOCUMENTS

| | | | |
|---|---|---|---|
| 2013/0021039 A1* | 1/2013 | Bjorklund | G01R 31/088 324/535 |
| 2013/0088802 A1 | 4/2013 | Berggren et al. | |
| 2014/0022680 A1* | 1/2014 | Berggren | H02H 3/02 361/79 |
| 2015/0116876 A1* | 4/2015 | Whitehouse | H02H 3/06 361/66 |
| 2015/0233976 A1* | 8/2015 | Johannesson | G01R 31/085 324/764.01 |
| 2015/0270704 A1* | 9/2015 | Qi | H02H 7/268 361/63 |

* cited by examiner

COMMUNICATION-LESS FAULT SECTION IDENTIFICATION FOR HYBRID HVDC TRANSMISSION SYSTEMS

CROSS-REFERENCE TO RELATED APPLICATIONS

This is the U.S. National Stage of International Application No. PCT/US2016/033218, filed May 19, 2016, which claims the benefit of U.S. Provisional Patent Application No. 62/166,869 filed May 27, 2015, which is incorporated by reference herein in its entirety.

FIELD

This application pertains to hybrid high voltage direct current (HVDC) electric power transmission systems, and in particular, to systems and methods for communication-less fault section identification in hybrid HVDC transmission systems.

BACKGROUND

A high voltage direct current (HVDC) electric power transmission system is a power transmission system that uses direct current for the bulk transmission of electrical power, typically over long distances. An HVDC transmission system that utilizes both underground/undersea cables and overhead transmission lines to transmit electrical power is here referred to as a hybrid HVDC transmission system. Hybrid HVDC transmission systems present a solution to transmit electricity in areas that have environmental constraints or permission issues.

Modern HVDC power transmission systems use electronic converters to make the power conversions that are required for transmission. In particular, a first converter station (commonly referred to as the rectifier station) is used to convert generated AC power into high voltage DC power for transmission over long distances. At the destination end of the transmission system, a second converter station (commonly referred to as the inverter station) is used to convert the received high voltage DC power into AC power that is appropriate for customer use.

One type of HVDC power transmission technology currently in use is known as line-commutated converter (LCC) HVDC power transmission. This type of system uses thyristors to construct the switching elements of the converters and commutation is carried out by the AC system voltage. Another, newer type of HVDC power transmission technology is known as voltage-sourced converter (VSC) HVDC power transmission. This type of system uses IGBTs (or similar power semiconductor devices) to construct the switching elements of the converters and offers certain benefits over LCC technology, such as the ability to control both real and reactive power flow. However, critical issues with VSC HVDC technology are currently preventing widespread deployment of the technology. In particular, all HVDC transmission systems regardless of type require a fault handling system to isolate faults, diminish the fault current, and return the system to full power operation in a short period of time.

A primary issue associated with VSC HVDC systems is that, in the event of a system fault, the energy stored in submodule capacitors of the system will quickly feed the system fault if not appropriately protected against. If a non-local communications channel were to be employed for purposes of implementing a fault protection/handling system, time delays would be introduced, which in turn would impact the speed of protection response. Associated with this communications delay, the capacitive energy has additional time to feed system faults.

SUMMARY

Disclosed herein are methods, systems, and devices for identifying a location of a fault in a hybrid high voltage direct current (HVDC) transmission system having a cable section and an overhead line section. Some methods comprise determining whether a characteristic voltage oscillation is present at a cable side terminal of the HVDC transmission system, and in response, determining that the fault is located in the overhead line section. Some methods comprise determining whether a characteristic current oscillation or a terminal current exceeding a peak current threshold is present at an overhead line side terminal, and in response, determining that the fault is located in the overhead line section. The methods can be communication-less, wherein the actions are based on local measurements and/or are performed locally to where the fault is located or detected, without using communications channels to communicate between substations.

Some methods further comprise reclosing a cable side circuit breaker of the HVDC transmission system and commencing a restart of the HVDC transmission system responsive to determining that the characteristic voltage oscillation is present at the cable side terminal.

Some methods further comprise, responsive to determining that the characteristic voltage oscillation is not present at the cable side terminal and responsive to determining that a predetermined time period has expired, determining whether a voltage at the cable side terminal exceeds a buildup detection voltage threshold, responsive to determining that the voltage at the cable side terminal exceeds the buildup detection voltage threshold, determining that the fault is located in the overhead line section, and responsive to determining that the voltage at the cable side terminal does not exceed the buildup detection voltage threshold, determining that the fault is located in the cable section.

Some methods further comprise reclosing a cable side circuit breaker of the HVDC transmission system and commencing a restart of the HVDC transmission system responsive to determining that the voltage at the cable side terminal exceeds the buildup detection voltage threshold, and not reclosing the cable side circuit breaker of the HVDC transmission system and not commencing a restart of the HVDC transmission system responsive to determining that the voltage at the cable side terminal does not exceed the buildup detection threshold.

In some methods, determining whether a characteristic voltage oscillation is present comprises determining whether a voltage at the cable side terminal exceeds a predetermined oscillation detection voltage threshold. In some methods, the characteristic voltage oscillation comprises a signal having a frequency of about 10 Hz.

Some methods further comprise determining that a cable side circuit breaker has been operated prior to determining whether a characteristic voltage oscillation is present.

Also disclosed herein are relay modules for a hybrid high voltage direct current (HVDC) transmission systems having a cable section and an overhead line section. The relay modules include a control system that stores and is structured to execute a number of routines structured to carry out the methods disclosed herein, such as determining whether a characteristic voltage oscillation is present at a cable side terminal of the HVDC transmission system, and in response, determining that the fault is located in the overhead line section. The number of routines can be dependent on measurements local to the cable side terminal.

The foregoing and other objects, features, and advantages of the disclosed technology will become more apparent from the following detailed description, which proceeds with reference to the accompanying figures.

DETAILED DESCRIPTION

Figure 1:
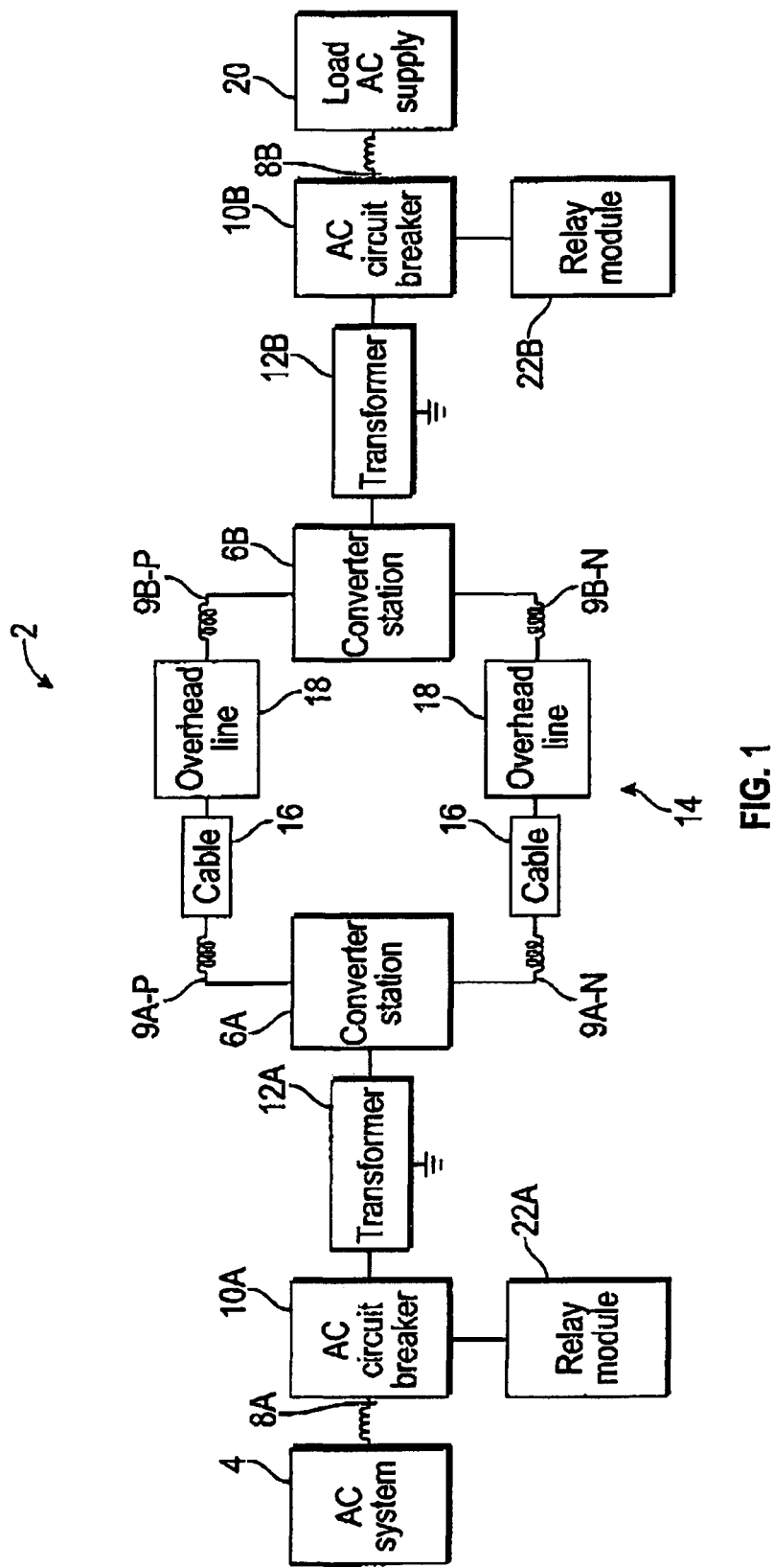
FIG. 1 is a system diagram for an exemplary hybrid high voltage direct current (HVDC) transmission system having a cable section and an overhead line section.

As used herein, the singular form of "a", "an", and "the" include plural references unless the context clearly dictates otherwise.

As used herein, the statement that two or more parts or components are "coupled" shall mean that the parts are joined or operate together either directly or indirectly, e.g., through one or more intermediate parts or components.

As used herein, "directly coupled" means that two elements are directly in contact with each other.

As used herein, the term "number" shall mean one or an integer greater than one (i.e., a plurality).

As used herein, the term "terminal" shall mean a point of electrical connection.

As used herein, the term "cable side terminal" shall mean the point of electrical connection between the cable and adjacent electronic converter.

As used herein, the term "overhead line side terminal" shall mean the point of electrical connection between the overhead line and adjacent electronic converter.

As used herein, the terms "component" and "system" are intended to refer to a computer related entity, either hardware, a combination of hardware and software, software, or software in execution. For example, a component can be, but is not limited to being, a process running on a processor, a processor, an object, an executable, a thread of execution, a program, and/or a computer. By way of illustration, both an application running on a server and the server can be a component. One or more components can reside within a process and/or thread of execution, and a component can be localized on one computer and/or distributed between two or more computers.

As used herein, the term "and/or" used between the last two of a list of elements means any one or more of the listed elements. For example, the phrase "A, B, and/or C" means "A," "B," "C," "A and B," "A and C," "B and C" or "A, B and C."

Directional phrases used herein, such as, for example and without limitation, top, bottom, left, right, upper, lower, front, back, and derivatives thereof, relate to the orientation of the elements shown in the drawings and are not limiting upon the claims unless expressly recited therein.

Although the operations of some of the disclosed methods are described in a particular, sequential order for convenient presentation, it should be understood that this manner of description encompasses rearrangement, unless a particular ordering is required by specific language. For example, operations described sequentially may in some cases be rearranged or performed concurrently. Moreover, for the sake of simplicity, the attached figures may not show the various ways in which the disclosed methods can be used in conjunction with other methods.

The disclosed technology is described herein, for purposes of explanation, in connection with numerous specific exemplary details in order to provide a thorough understanding of the subject matter. It will be evident, however, that the present novel technology can be practiced without these specific details without departing from the spirit and scope of this innovation.

FIG. 1 is a schematic diagram of a hybrid HVDC transmission system 2 according to an exemplary embodiment of the disclosed concept. Hybrid HVDC transmission system 2 includes an AC system 4 which generates AC power using any suitable method. The AC power generated by AC system 4 is provided to a first converter station 6A through a first terminal 8A, a first AC circuit breaker 10A, and a step up transformer 12A. First converter station 6A is structured to convert the AC power it receives from transformer 12A to DC power for subsequent transmission as described herein. Hybrid HVDC transmission system 2 also includes an HVDC line 14 which connects first converter station 6A to a second converter station 6B. In the illustrated exemplary embodiment, HVDC line 14 includes a cable section 16 (comprising underground and/or undersea cables) which is connected to an overhead line section 18.

As seen in FIG. 1, in the illustrated exemplary embodiment, cable section 16 and overhead line section 18 are adjacent to and directly connected to one another, with cable section 16 being directly connected to the first converter station 6A at cable side terminal 9A (including positive (9A-P) and negative (9A-N) connections) and overhead line section 18 being directly connected to the second converter station 6B at overhead line side terminal 9B (including positive (9B-P) and negative (9B-N) connections). It will be understood, however, that this configuration is exemplary only and that the positions of cable section 16 and overhead line section 18 may be switched within the scope of the disclosed concept. Second converter station 6B is structured to convert the DC power it receives through HVDC line 14 back to AC power. That AC power is provided to a step down transformer 12B which in turn provides the stepped down AC power to a local AC supply 20 (for feeding a number of loads) through a second AC circuit breaker 10B and a second terminal 8B.

In the exemplary embodiment, hybrid HVDC transmission system 2 is a VSC HVDC power transmission system, and thus both first converter station 6A and second converter station 6B comprise voltage sourced converters employing IGBTs or similar devices to form the switching elements thereof. Any suitable VSC converter topology may be employed to implement first converter station 6A and second converter station 6B, such as, without limitation, the modular multilevel converter (MMC) topology that is well known in the art.

In addition, as seen in FIG. 1, HVDC transmission system 2 further includes a first relay module 22A that is operatively coupled to first AC circuit breaker 10A, and a second relay module 22B that is operatively coupled to second AC circuit breaker 10B. As is known in the art, a relay module is a protective device that measures the voltage and/or current at a given location and sends signals to an AC circuit breaker to open and close the AC circuit breaker as appropriate based on the voltage and/or current measurements. Thus, in the illustrated exemplary embodiment, first relay module 22A is structured to measure the voltage and current at terminal 9A and send signals to first AC circuit breaker 10A to open and close first AC circuit breaker 10A as appropriate. Similarly, second relay module 22B is structured to measure the voltage and current at terminal 9B and send signals to second AC circuit breaker 10B to open and close second AC circuit breaker 10B as appropriate.

Figure 2:
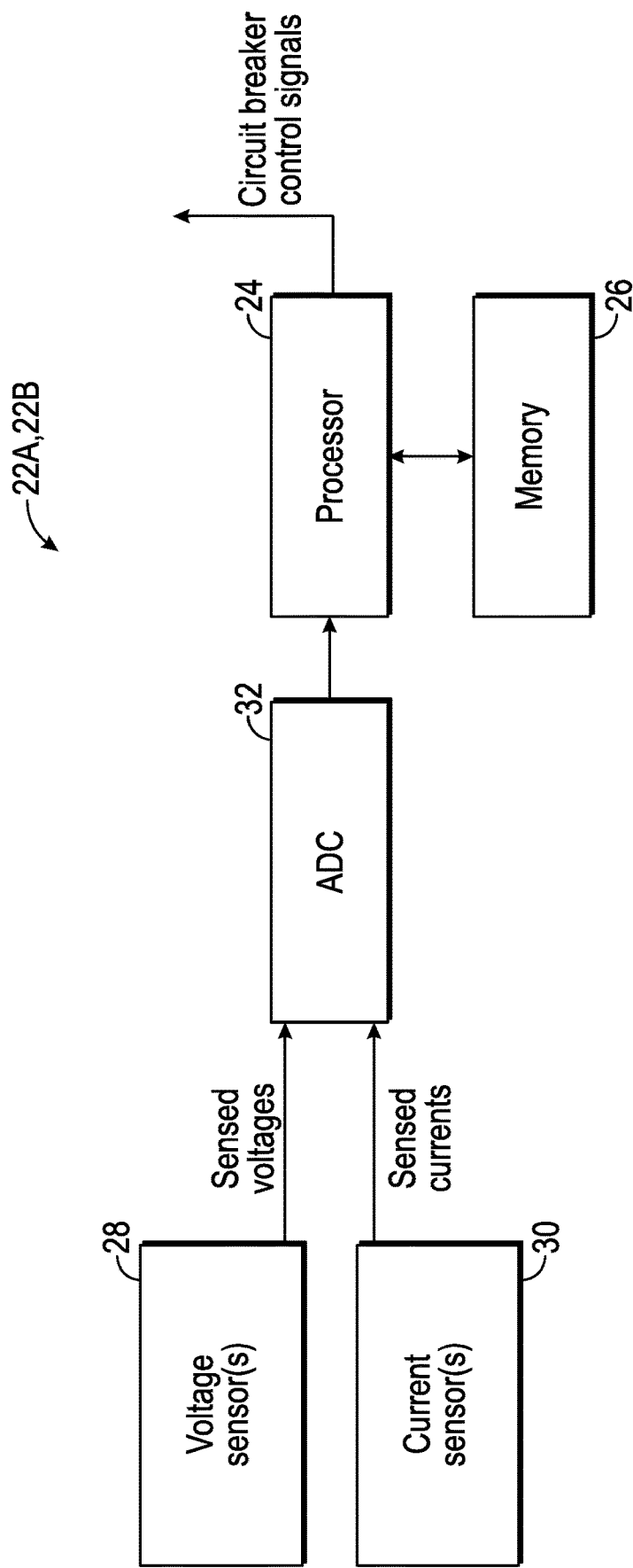
FIG. 2 is a schematic diagram of exemplary relay modules comprising computing device having a control system including a processor and a memory.

FIG. 2 is a schematic diagram of first and second relay modules 22A, 22B according to one non-limiting exemplary embodiment. In the exemplary embodiment, each relay module 22A, 22B comprises a computing device having a control system including a processor 24 and a memory 26. Processor 24 may be, for example and without limitation, a microprocessor (µP), a microcontroller, or some other suitable processing device, that interfaces with memory 26. Memory 26 can be any one or more of a variety of types of internal and/or external storage media such as, without limitation, RAM, ROM, EPROM(s), EEPROM(s), FLASH, and the like that provide a storage register, i.e., a machine readable medium, for data storage such as in the fashion of an internal storage area of a computer, and can be volatile memory or nonvolatile memory. Memory 26 has stored therein a number of routines that are executable by processor 24. One or more of the routines implement (by way of computer/processor executable instructions) at least one embodiment of the methods discussed in greater detail below for identifying faults sections in HVDC transmission system 2 and taking appropriate action based thereon.

Furthermore, as seen in FIG. 2, each relay module 22A, 22B further includes a number of voltage sensors 28 (e.g., voltage transformers) for measuring the voltage at terminals 9A, 9B, respectively, and a number of current sensors 30 (e.g. current transformers) for measuring the current at terminals 9A, 9B, respectively. In the exemplary embodiment, the voltage sensors 28 and current sensors 30 make respective voltage and current measurements on the line side of the associated converter station 6A, 6B. The analog signals generated by the number of voltage sensors 28 and the number of current sensors 30 are fed to an analog-to-digital converter 32 which converts those signals into digital form and provides them to processor 24 for use as described herein.

In operation, first relay module 22A monitors the voltage and current at terminal 9A for conditions indicative of a fault in hybrid HVDC transmission system 2, and similarly second relay module 22B monitors the voltage and current at terminal 9B for conditions indicative of a fault in hybrid HVDC transmission system 2. When first and second relay modules 22A, 22B determine that a fault has occurred, each will generate and transmit a signal for opening the associated AC circuit breaker 10A, 10B in order to protect hybrid HVDC transmission system 2 from the fault. Thus, in HVDC transmission system 2, it is important for fault current to be extinguished quickly (i.e., decayed to the zero) so that the converter fault withstand rating of each converter station 6A, 6B is not surpassed and so that a system restart sequence, including re-closing of AC circuit breakers 10A, 10B followed by voltage stabilization and restart of power flow, can commence as soon as possible.

In this regard, it is important to note that if the fault occurs in cable section 16, the fault is considered to be permanent and a re-closure/restart procedure cannot start until the cable is repaired or replaced. Conversely, if the fault occurs in overhead line section 18, the fault is considered to be temporary the re-closure/restart procedure can start immediately. Thus, it is desirable to identify the faulted section of HVDC line 14 in order to know whether or not to attempt an immediate reclose of AC circuit breakers 10A, 10B and system restart. Again, in the case of a non-permanent fault on HVDC line 14, an immediate attempt to reclose AC circuit breakers 10A, 10B is desirable for system restart. In the case of a permanent fault, likely to occur within cable section 16 since all cable faults can be assumed to be permanent, reclosing the AC circuit breakers 10A, 10B and restarting the system is not possible until the faulty cable is repaired or replaced. An attempt to reclose during a permanent fault will be unsuccessful, and is known as a false reclose. A false reclose will only result in feeding the fault and can potentially damage system components.

Some transmission systems implement protective relay coordination for system fault handling/protection using a long distance communication channel between the converter stations. This is primarily due to the fact that most transmission relay protection is in the form of line current differential protection which requires a communications channel inherent to the relay function. However, communications in fault handling/protection inherently slow down the process of restarting the transmission system after a fault event. Long distance communications are also expensive and can often be unreliable. For the purpose of faster fault isolation and faster system restart, it is therefore desirable to design a protection coordination scheme that does not utilize long distance communications channel between converter stations, but rather utilizes local measurements, local communications, local determinations, and local responsive actions. These actions can all occur at or near a single converter station or substation at or near where the fault occurs, such as at the junctions between lines and the substation, including the substation and the DC line terminations. This can save time and reduce energy loss and energy shortages/blackouts compared to systems that employ long distance communications for system fault detection/response.

Hence, as described in detail herein, the disclosed concept presents a novel solution to this problem by employing a methodology that can quickly determine the faulted section within HVDC line 14 without the aid of telecommunication. In particular, the methodology of the disclosed concept is able to determine whether a given DC fault is located in cable section 16 or overhead line section 18 without using a communications channel. Thereafter, once that determination is made, system restart can be attempted for faults that are identified to have occurred in overhead line section 18 (temporary faults), while for faults identified in cable section 16 (permanent faults), hybrid HVDC transmission system 2 will remain in shutdown mode until the faulty cable is repaired or replaced.

Figure 3:
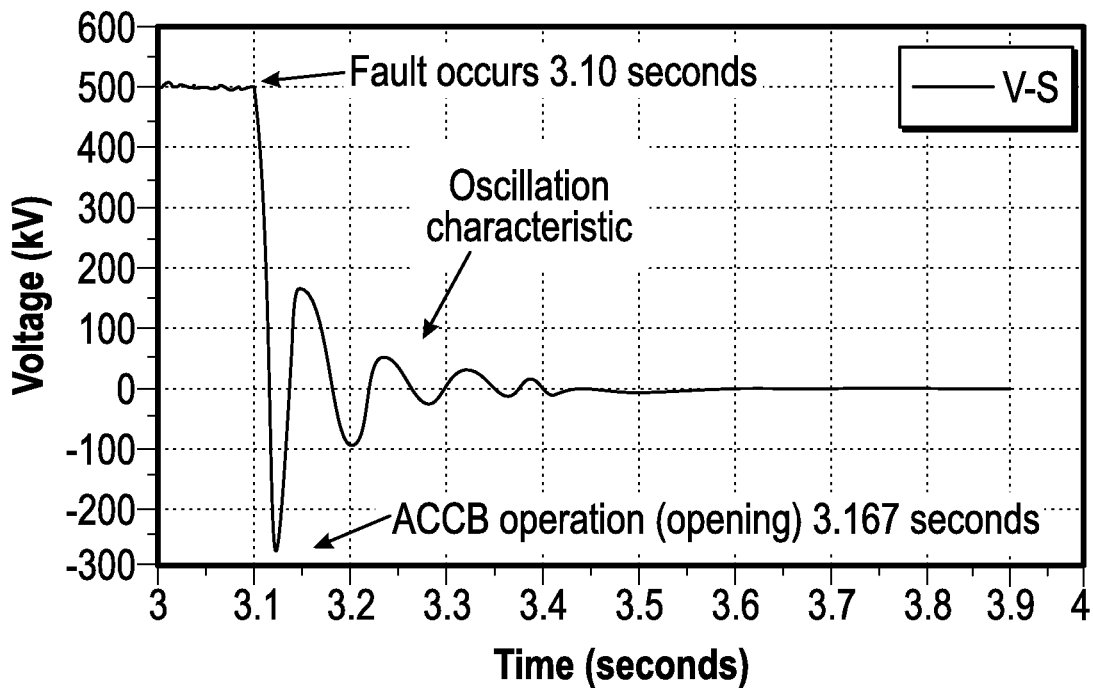
FIG. 3 is a graph showing oscillation in voltage over time within an HVDC transmission system after a fault occurs.
Figure 4:
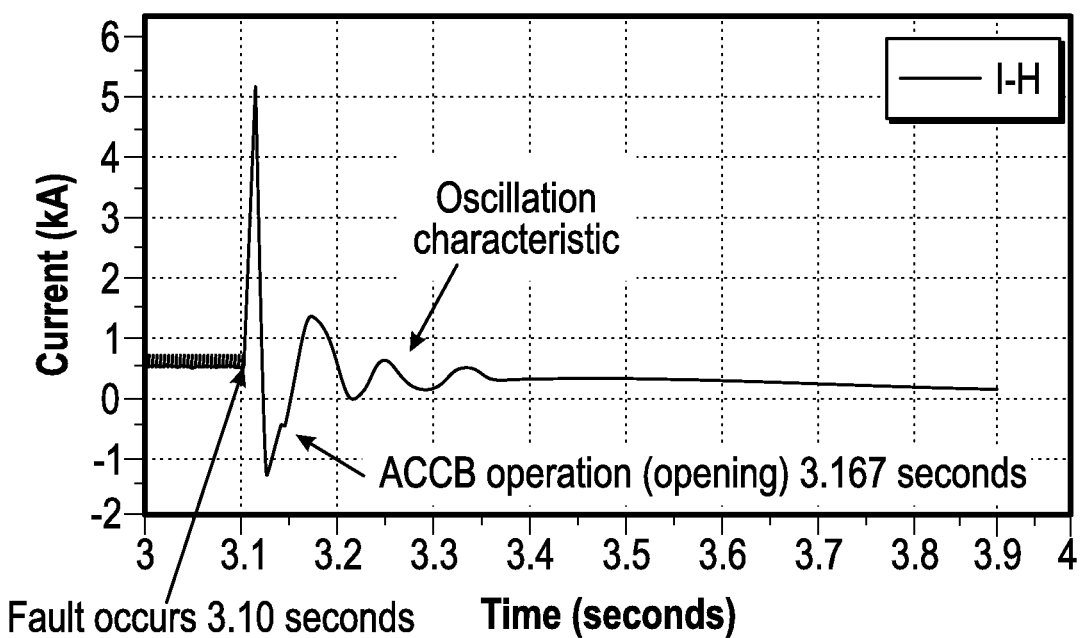
FIG. 4 is a graph showing oscillation in current over time within an HVDC transmission system after a fault occurs.

In the case of certain types of faults within hybrid HVDC transmission system 2 and post opening of AC circuit breakers 10A, 10B, a distinct signal characteristic exists within hybrid HVDC transmission system 2. In particular, that distinct signal characteristic is, in the non-limiting exemplary embodiment, in the form of a low frequency oscillation in the range of about 10 Hz (which frequency, however, may vary based on the particulars of the implementation), shown in exemplary form in FIG. 3 (oscillation in voltage) and FIG. 4 (oscillation in current), and is present only in the case of a pole-to-ground (also referred to as a line-to-ground) fault in overhead line section 18. More specifically, the present inventors have determined that, for pole-to-ground faults in overhead line section 18, such an oscillation exists in voltage form only at the terminal closest to cable section 16 (e.g., terminal 9A in the illustrated example) and that such an oscillation simultaneously exists in current form only at the terminal closest to overhead line section 18 (terminal 9B in the illustrated example). Furthermore, the characteristic oscillation signal is not present in the case of pole-to-pole faults in overhead line section 18 or in pole-to-ground or pole-to-pole faults in cable section 16. Thus, the detection of the presence of such an oscillating signal may be used as an indicator of a pole-to-ground fault in overhead line section 18 and thus an indicator that a system reclose/restart can commence as soon as the fault current has decayed completely.

However, as noted above, it is also desirable to commence a system reclose/restart as soon as the fault current has decayed completely in the case of pole-to pole faults in overhead line section 18. Thus, the detection of the characteristic oscillating signal as described herein is not enough to classify all types of faults that permit immediate (i.e., as the fault current has decayed completely) commencement of system restart. In other words, whenever there is a pole-to-pole fault in overhead line section 18, there is a challenge to identifying that type of fault because the characteristic oscillating signal is not present. However, according to a further aspect of the disclosed concept, the inventors have determined that a high current will be observed on the terminal (terminal 9A or terminal 9B) that is nearest the faulted section. Thus, in the case of a fault that is not a pole-to-ground fault on overhead line section 18, detection of such a high current may be used to further classify/identify the location of the fault as being in either overhead line section 18 or cable section 16. In particular, in the exemplary embodiment shown in FIG. 1, if the high current is observed in terminal 9A, it is known that the fault is a pole-to-pole or a pole-to-ground fault in cable section 16, and if the high current is observed at terminal 9B, it is known that the fault is a pole-to-pole fault in overhead line section 18.

Thus, in cases where a pole-to-ground fault in overhead line 18 is detected based upon detection of the characteristic oscillating signal or where a pole-to-pole fault in overhead line 18 is detected based upon detection of the current threshold being surpassed at the terminal closest to overhead line section 18 (terminal 9B in the present example), relay module 22B may send a signal to AC circuit breaker 10B to reclose. However, as will be appreciated, in either of the two cases just described, it is also necessary to cause AC circuit breaker 10A to reclose so that the restart procedure may proceed. A challenge is presented as to how to accomplish such a reclosing operation at the terminal nearest cable section 16 (terminal 9A in the present example) without the aid of any telecommunications. According to a further aspect of the disclosed concept, this challenge is met using the voltage buildup that will occur at the terminal nearest cable section 16 (terminal 9A in the present example) as a result of successful reclose of the AC circuit breaker closest to overhead line section 18 (AC circuit breaker 10B in the present example). More specifically, voltage buildup at the terminal nearest cable section 16 (terminal 9A in the present example) is monitored and relay module 22A will initiate a reclosing operation by sending a signal to AC circuit breaker 10A when a certain predetermined voltage threshold is determined to have been surpassed. As will be appreciated, this will successfully reclose the cable side circuit breaker without necessitating a communications channel in hybrid HVDC transmission system 2. It is important to note, however, that when a pole-to-pole fault occurs in cable section 16, a peak current but not a peak voltage will exist at terminal 9A, but because relay module 22A is only making a voltage threshold detection to detect oscillation, no attempt to reclose will occur.

Figure 5:
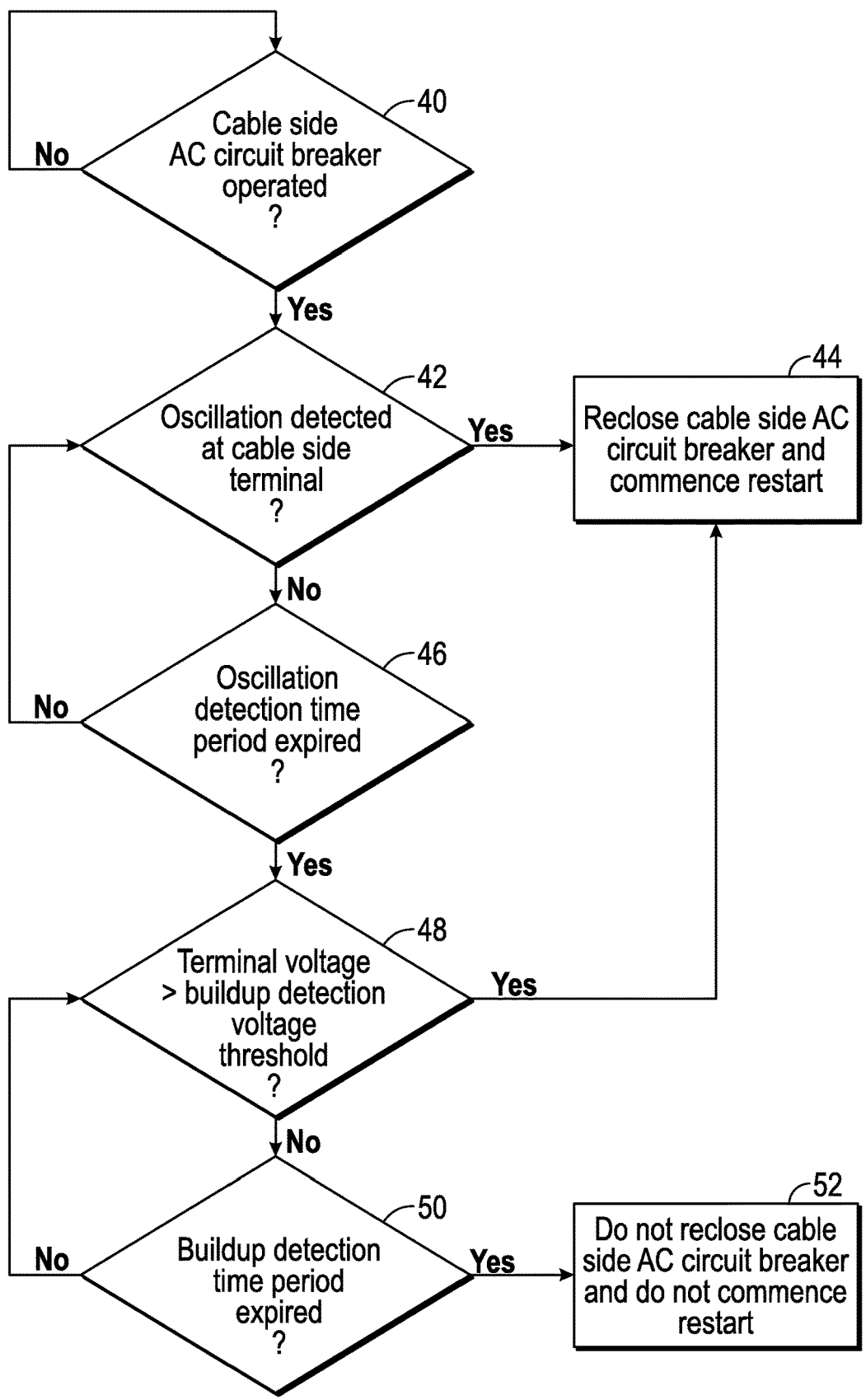
FIG. 5 is a flow chart illustrating an exemplary method disclosed herein for determining whether to reclose a cable side AC circuit breaker and commence restart of the system.

FIG. 5 is a flowchart showing a method of fault section identification that may be implemented in the cable side relay module 22A according to an aspect of the disclosed concept. The method shown in FIG. 5 may be implemented in one or more routines stored in the memory 26 of relay module 22A and executable by the processor 24 of relay module 22A. The method begins at step 40, wherein a determination is made as to whether cable side AC circuit breaker 10A has been operated (i.e., has been opened). If the answer is no, then the method returns to step 40. If, however, the answer at step 40 is yes, then the method proceeds to step 42. At step 42, a determination is made as to whether the characteristic oscillation described herein has been detected at cable side terminal 9A by relay module 22A. In the exemplary embodiment, such an oscillation is detected by relay module 22A by monitoring the voltage at terminal 9A using a voltage sensor 28 and determining whether that voltage has exceeded a predetermined oscillation detection voltage threshold. In the exemplary embodiment, this threshold is ultimately determined and set during a sensitivity analysis that is provided as a part of a specific installation of HVDC transmission system 2. It will be understood, however, that other methods for detecting the characteristic oscillating signal, such as looking for a signal with the characteristic frequency, are contemplated within the scope of the disclosed concept. If the answer at step 42 is yes, meaning that the characteristic oscillation has been detected, thereby indicating that a pole-to-ground fault in overhead line section 18 has occurred, then, at step 44, relay module 22A takes steps to reclose cable side AC circuit breaker 10A and commence a restart procedure.

If the answer at step 42 is no, meaning that the characteristic oscillation has not been detected (i.e., no pole-to-ground fault in overhead line section 18 detected), then the method proceeds to step 46. At step 46, a determination is made as to whether a predetermined oscillation detection time period has expired. If the answer is no, then the method returns to step 42. However, if the answer at step 46 is yes, then the method proceeds to step 48. At step 48, a determination is made as to whether the voltage at terminal 9A has exceeded a predetermined buildup detect threshold (caused by the reclosure of AC circuit breaker 10B as described elsewhere herein). If the answer at step 48 is yes (which is indicative of a pole-to-pole fault in overhead line section 18 is described herein), then the method proceeds to step 44 and the above-described reclose and restart procedure is initiated. If the answer at step 48 is no, then at step 50 a determination is made as to whether a predetermined buildup detection time period has expired. If the answer is no, then the method returns to step 48. If the answer at step 50 is yes, then the method proceeds to step 52, wherein relay module 22A determines that the AC circuit breaker 10A should not be reclosed and that a restart procedure should not be commenced because the fault is a fault occurring in cable section 16. As described herein, HVDC transmission system 2 will stay in such a shutdown mode until the cable fault has been repaired or replaced.

In the method of FIG. 5, the buildup detection voltage threshold and the oscillation detection voltage threshold may be the same value or may be different, depending upon the particulars of the installation.

Figure 6:
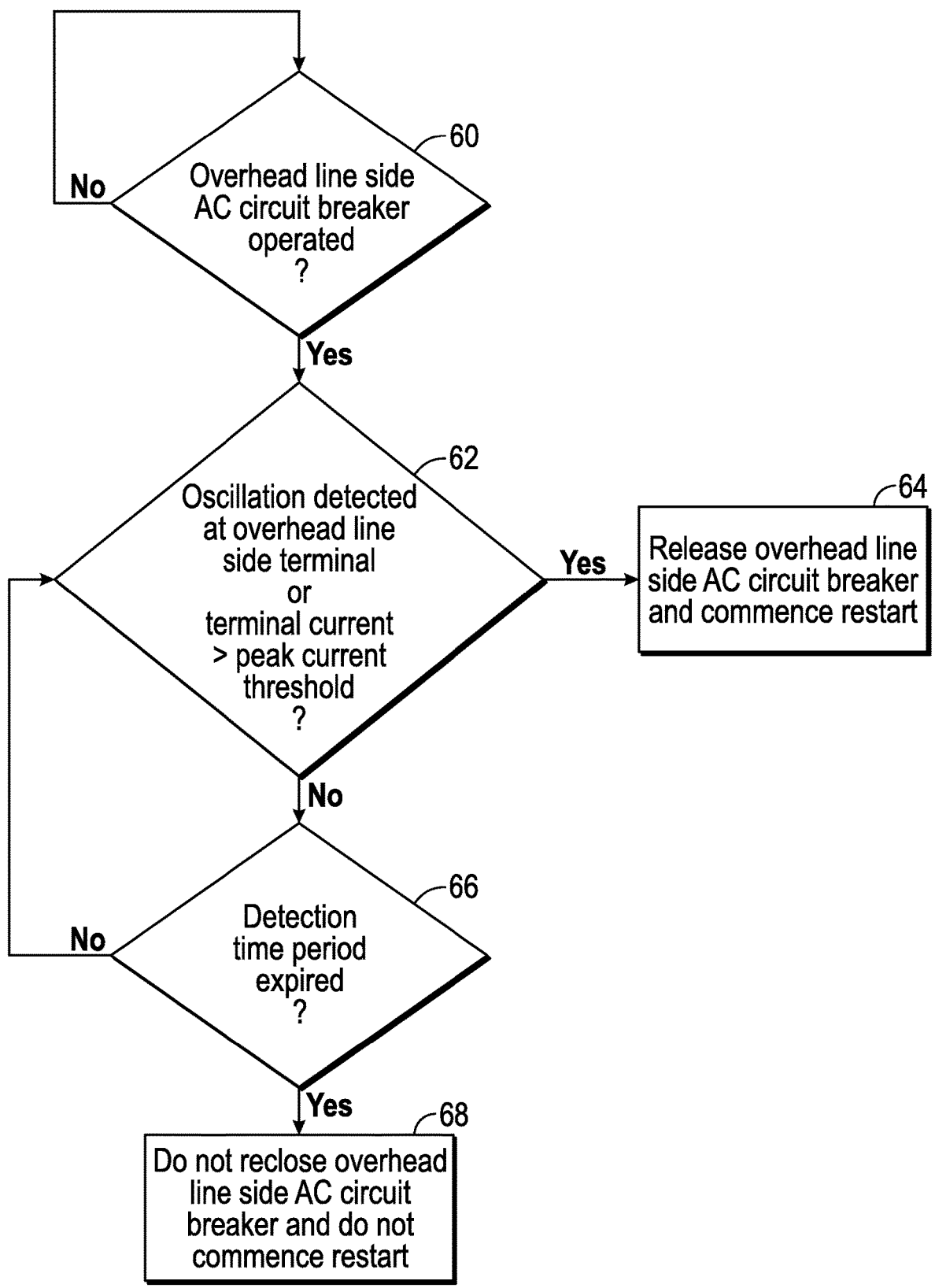
FIG. 6 is a flow chart illustrating an exemplary method disclosed herein for determining whether to reclose an overhead line side AC circuit breaker and commence restart of the system.

FIG. 6 is a flowchart showing a method of fault section identification that may be implemented in the overhead line side relay module 22B according to another aspect of the disclosed concept. The method shown in FIG. 6 may be implemented in one or more routines stored in the memory 26 of relay module 22B and executable by the processor 24 of relay module 22B. The method begins at step 60, wherein a determination is made as to whether overhead line side AC circuit breaker 10B has been operated (i.e., has been opened). If the answer is no, then the method returns to step 60. If, however, the answer at step 60 is yes, then the method proceeds to step 62. At step 62, a determination is made as to whether: (i) the characteristic oscillation has been detected at overhead line side terminal 9B (which is indicative of a pole-to-ground fault in overhead line section 18), or (ii) the current at terminal 8 as measured by a current sensor 30 is greater than a predetermined peak current threshold (which is indicative of a pole-to-pole fault in overhead line section 18). In the exemplary embodiment, such an oscillation is detected by relay module 22B by monitoring the current at terminal 9B using a current sensor 28 and determining whether that current has exceeded a predetermined oscillation detection current threshold. In the exemplary embodiment, this threshold is ultimately determined and set during a sensitivity analysis that is provided as a part of a specific installation of HVDC transmission system 2. It will be understood, however, that other methods for detecting the characteristic oscillating signal, such as looking for a signal with the characteristic frequency, are contemplated within the scope of the disclosed concept. If the answer at step 62 is yes, meaning that the fault is within overhead line section 18, then the method proceeds to step 64 wherein relay module 22B takes steps to reclose overhead line side AC circuit breaker 10B and commence a restart procedure. If the answer at step 62 is no, then the method proceeds to step 66, wherein a determination is made as to whether a predetermined detection time period has expired. If the answer at step 66 is no, the method returns to step 62. If, however, the answer at step 66 is yes, that is indicative of a pole-to-ground or a pole-to-pole fault in cable section 16, and the method proceeds to step 68. At step 68, relay module 22B determines that the AC circuit breaker 10B should not be reclosed and that a restart procedure should not be commenced because the fault is a fault occurring in cable section 16. As described herein, since AC circuit breaker 10B has not been reclosed, voltage buildup will not occur at terminal 9A and as a result AC circuit breaker 10 A will not be re-closed. Instead, HVDC transmission system 2 will stay in such a shutdown mode until the cable fault has been repaired or replaced.

Thus, the disclosed concept provides a novel methodology for quickly determining the faulted section within HVDC line 14 without the aid of telecommunication so that reclosure and restart can occur immediately where appropriate and so that reclosure and restart will be prevented where appropriate until the fault is cleared.

In the claims, any reference signs placed between parentheses shall not be construed as limiting the claim. The word "comprising" or "including" does not exclude the presence of elements or steps other than those listed in a claim. In a device claim enumerating several means, several of these means may be embodied by one and the same item of hardware. The word "a" or "an" preceding an element does not exclude the presence of a plurality of such elements. In any device claim enumerating several means, several of these means may be embodied by one and the same item of hardware. The mere fact that certain elements are recited in mutually different dependent claims does not indicate that these elements cannot be used in combination.

Although the disclosed technology has been described in detail for the purpose of illustration based on certain embodiments, it is to be understood that the innovative technology disclosed herein is not limited to the particularly disclosed embodiments, but is intended to cover modifications and equivalent arrangements that are within the spirit and scope of the appended claims. For example, it is to be understood that the disclosure contemplates that, to the extent possible, one or more features of any embodiment can be combined with one or more features of any other embodiment.

The invention claimed is:

1. A method of identifying a location of a fault in a hybrid high voltage direct current (HVDC) transmission system having a cable section and an overhead line section, the method comprising:
   determining whether a characteristic voltage oscillation is present at a cable side terminal of the HVDC transmission system;
   responsive to determining that the characteristic voltage oscillation is present at the cable side terminal, determining that the fault is located in the overhead line section; and
   responsive to determining that the characteristic voltage oscillation is not present at the cable side terminal and responsive to determining that a predetermined time period has expired, determining whether a voltage at the cable side terminal exceeds a buildup detection voltage threshold, responsive to determining that the voltage at the cable side terminal exceeds the buildup detection voltage threshold, determining that the fault is located in the overhead line section, and responsive to determining that the voltage at the cable side terminal does not exceed the buildup detection voltage threshold, determining that the fault is located in the cable section.

2. The method according to claim 1, wherein the method is performed locally without using a long distance communication channel between converter stations.

3. The method according to claim 1, further comprising reclosing a cable side circuit breaker of the HVDC transmission system and commencing a restart of the HVDC transmission system responsive to determining that the characteristic voltage oscillation is present at the cable side terminal.

4. The method according to claim 1, further comprising reclosing a cable side circuit breaker of the HVDC transmission system and commencing a restart of the HVDC transmission system responsive to determining that the voltage at the cable side terminal exceeds the buildup detection voltage threshold, and not reclosing the cable side circuit breaker of the HVDC transmission system and not commencing a restart of the HVDC transmission system responsive to determining that the voltage at the cable side terminal does not exceed the buildup detection threshold.

5. The method according to claim 1, wherein the determining whether a characteristic voltage oscillation is present comprises determining whether a voltage at the cable side terminal exceeds a predetermined oscillation detection voltage threshold.

6. The method according to claim 1, wherein the characteristic voltage oscillation comprises a signal having a frequency of about 10 Hz.

7. The method according to claim 1, further comprising determining that a cable side circuit breaker has been operated prior to determining whether a characteristic voltage oscillation is present.

8. A relay module for a hybrid high voltage direct current (HVDC) transmission system having a cable section and an overhead line section, comprising:
a control system, wherein the control system stores and is structured to execute a number of routines, the number of routines being structured to:
determine whether a characteristic voltage oscillation is present at a cable side terminal of the HVDC transmission system;
responsive to determining that the characteristic voltage oscillation is present at the cable side terminal, determine that the fault is located in the overhead line section; and
responsive to determining that the characteristic voltage oscillation is not present at the cable side terminal and responsive to determining that a predetermined time period has expired, determine whether a voltage at the cable side terminal exceeds a buildup detection voltage threshold, responsive to determining that the voltage at the cable side terminal exceeds the buildup detection voltage threshold, determine that the fault is located in the overhead line section, and responsive to determining that the voltage at the cable side terminal does not exceed the buildup detection voltage threshold, determine that the fault is located in the cable section.

9. The relay module according to claim 8, wherein the number of routines are dependent on measurements local to the cable side terminal.

10. The relay module according to claim 8, wherein the routines are further structured to generate one or more signals for reclosing a cable side circuit breaker of the HVDC transmission system and commencing a restart of the HVDC transmission system responsive to determining that the characteristic voltage oscillation is present at the cable side terminal.

11. The relay module according to claim 8, wherein the routines are further structured to generate one or more signals for reclosing a cable side circuit breaker of the HVDC transmission system and commencing a restart of the HVDC transmission system responsive to determining that the voltage at the cable side terminal exceeds the buildup detection voltage threshold, and wherein the relay module is structured to not take any action for reclosing the cable side circuit breaker of the HVDC transmission system and commencing a restart of the HVDC transmission system responsive to determining that the voltage at the cable side terminal does not exceed the buildup detection threshold.

12. The relay module according to claim 8, wherein the routines are structured to determine whether a characteristic voltage oscillation is present by receiving a voltage value representing a voltage at the cable side terminal and determining whether the voltage value exceeds a predetermined oscillation detection voltage threshold.

13. The relay module according to claim 8, wherein the characteristic voltage oscillation comprises a signal having a frequency of about 10 Hz.

14. The relay module according to claim 8, wherein the routines are further structured to determine whether a cable side circuit breaker has been operated prior to determining whether a characteristic voltage oscillation is present.

15. A non-transitory computer readable medium storing one or more programs, including instructions, which when executed by a computer, causes the computer to perform the method of claim 1.

16. A method of identifying a location of a fault in a hybrid high voltage direct current (HVDC) transmission system having a cable section and an overhead line section, comprising:
determining whether:
(i) a characteristic current oscillation or
(ii) a terminal current exceeding a peak current threshold is present at an overhead line side terminal of the HVDC transmission system;
responsive to determining that either the characteristic current oscillation or the terminal current exceeding the peak current threshold is present at the overhead line side terminal, determining that the fault is located in the overhead line section; and
reclosing an overhead line side circuit breaker of the HVDC transmission system and commencing a restart of the HVDC transmission system responsive to determining that the characteristic current oscillation or the terminal current exceeding the peak current threshold is present at the overhead line side terminal.

17. The method according to claim 16, wherein the method is performed locally to the overhead line side terminal without long distance communications.

18. The method according to claim 16, wherein the determining whether a characteristic current oscillation is present comprises determining whether a current at the overhead line side terminal exceeds a predetermined oscillation detection current threshold.

19. The method according to claim 16, wherein the characteristic current oscillation comprises a signal having a frequency of about 10 Hz.

20. The method according to claim 16, further comprising determining that an overhead line side circuit breaker has been operated prior to determining whether a characteristic current oscillation is present.

21. The method according to claim 16, further comprising determining that the fault is located in the cable section responsive to determining that neither the characteristic current oscillation nor the terminal current exceeding the peak current threshold is present at the overhead line side terminal for at least a certain time period following a determination that overhead line side circuit breaker has been operated.

22. A relay module for a hybrid high voltage direct current (HVDC) transmission system having a cable section and an overhead line section, comprising:
a control system, wherein the control system stores and is structured to execute a number of routines, the number of routines being structured to:
determined whether:
(i) a characteristic current oscillation or
(ii) a terminal current exceeding a peak current threshold is present at an overhead line side terminal of the HVDC transmission system;
responsive to determining that either the characteristic current oscillation or the terminal current exceeding the peak current threshold is present at the overhead line side terminal, determine that the fault is located in the overhead line section; and generate one or more signals for reclosing an overhead line side circuit breaker of the HVDC transmission system and commencing a restart of the HVDC transmission system responsive to determining that the characteristic current oscillation or the terminal current exceeding the peak current threshold is present at the overhead line side terminal.

23. The relay module according to claim 22, wherein the number of routines are dependent on measurements local to the overhead line side terminal.

24. The relay module according to claim 22, wherein routines are structured to determine whether a characteristic current oscillation is present comprises by determining whether a current at the overhead line side terminal exceeds a predetermined oscillation detection current threshold.

25. The relay module according to claim 22, wherein the characteristic current oscillation comprises a signal having a frequency of about 10 Hz.

26. The relay module according to claim 22, wherein the routines are further structured to determine that an overhead line side circuit breaker has been operated prior to determining whether a characteristic current oscillation is present.

27. The relay module according to claim 26, wherein the routines are further structured to determine that the fault is located in the cable section responsive to determining that neither the characteristic current oscillation nor the terminal current exceeding the peak current threshold is present at the overhead line side terminal for at least a certain time period following a determination that overhead line side circuit breaker has been operated.

28. A non-transitory computer readable medium storing one or more programs, including instructions, which when executed by a computer, causes the computer to perform the method of claim 16.

29. A method of identifying a location of a fault in a hybrid high voltage direct current (HVDC) transmission system having a cable section and an overhead line section, the method comprising:
    determining whether a characteristic voltage oscillation is present at a cable side terminal of the HVDC transmission system;
    responsive to determining that the characteristic voltage oscillation is present at the cable side terminal, determining that the fault is located in the overhead line section; and
    reclosing a cable side circuit breaker of the HVDC transmission system and commencing a restart of the HVDC transmission system responsive to determining that the characteristic voltage oscillation is present at the cable side terminal.

30. A relay module for a hybrid high voltage direct current (HVDC) transmission system having a cable section and an overhead line section, comprising:
    a control system, wherein the control system stores and is structured to execute a number of routines, the number of routines being structured to:
        determine whether a characteristic voltage oscillation is present at a cable side terminal of the HVDC transmission system;
        responsive to determining that the characteristic voltage oscillation is present at the cable side terminal, determine that the fault is located in the overhead line section; and
        generate one or more signals for reclosing a cable side circuit breaker of the HVDC transmission system and commencing a restart of the HVDC transmission system responsive to determining that the characteristic voltage oscillation is present at the cable side terminal.

31. A method of identifying a location of a fault in a hybrid high voltage direct current (HVDC) transmission system having a cable section and an overhead line section, comprising:
    determining whether:
        (i) a characteristic current oscillation or
        (ii) a terminal current exceeding a peak current threshold is present at an overhead line side terminal of the HVDC transmission system;
    responsive to determining that either the characteristic current oscillation or the terminal current exceeding the peak current threshold is present at the overhead line side terminal, determining that the fault is located in the overhead line section; and
    determining that the fault is located in the cable section responsive to determining that neither the characteristic current oscillation nor the terminal current exceeding the peak current threshold is present at the overhead line side terminal for at least a certain time period following a determination that overhead line side circuit breaker has been operated.

* * * * *